United States Patent [19]

Smathers

[11] Patent Number: 5,111,574

[45] Date of Patent: May 12, 1992

[54] METHOD AND APPARATUS FOR PRODUCING SUPERCONDUCTING JOINTS

[75] Inventor: David B. Smathers, Salem, Oreg.

[73] Assignee: Teledyne Industries, Inc., Albany, Oreg.

[21] Appl. No.: 279,777

[22] Filed: Dec. 5, 1988

[51] Int. Cl.$^5$ .............................................. H01L 39/24
[52] U.S. Cl. ....................................... 29/599; 29/872; 228/193
[58] Field of Search .................. 29/599, 868, 869, 871, 29/872; 228/193, 194, DIG. 56

[56] References Cited

U.S. PATENT DOCUMENTS

| | | | |
|---|---|---|---|
| 3,703,032 | 11/1972 | Batista | 228/194 |
| 4,631,808 | 12/1986 | Jones | 29/599 |
| 4,794,688 | 1/1989 | Wada et al. | 29/869 X |

FOREIGN PATENT DOCUMENTS

| | | | |
|---|---|---|---|
| 154385 | 9/1982 | Japan | 228/193 |
| 80/02084 | 10/1980 | PCT Int'l Appl. | 29/871 |
| 1298068 | 11/1972 | United Kingdom | 228/DIG. 56 X |

Primary Examiner—Joseph M. Gorski
Attorney, Agent, or Firm—Shoemaker and Mattare, Ltd.

[57] ABSTRACT

A method for joining two or more superconducting wires each comprising a bundle of filaments of tin (Sn) and niobium (Nb) contained within a binder metal with a superconducting joint. The filaments on the ends of the wires to be joined are first exposed by etching the binder metal away with acid and then the exposed filaments are intertwined. The exposed filaments are then sealed in a copper-enriched chamber and heated to a temperature and for a time sufficient for the Sn and Nb to diffuse together and form $Nb_3Sn$ at their interface. Preferably, the filaments are sealed by forming a tubular jacket, placing the tubular jacket over the exposed filaments and the wire ends adjacent thereto, and swaging the ends of the tubular jacket to the wire ends adjacent the exposed filaments. The jacket can be formed by obtaining wire comprising a thick outer layer and a thin inner layer of copper separated by a thin barrier layer of a material chosen from the group consisting of vanadium, niobium, and tantalum, or the like, all disposed over a tin core, cutting the wire to desired jacket lengths, heating the jacket lengths of the wire to melt the tin cores thereof, and blowing the melted cores from the jacket lengths of the wire to form hollow cored jackets.

13 Claims, 2 Drawing Sheets

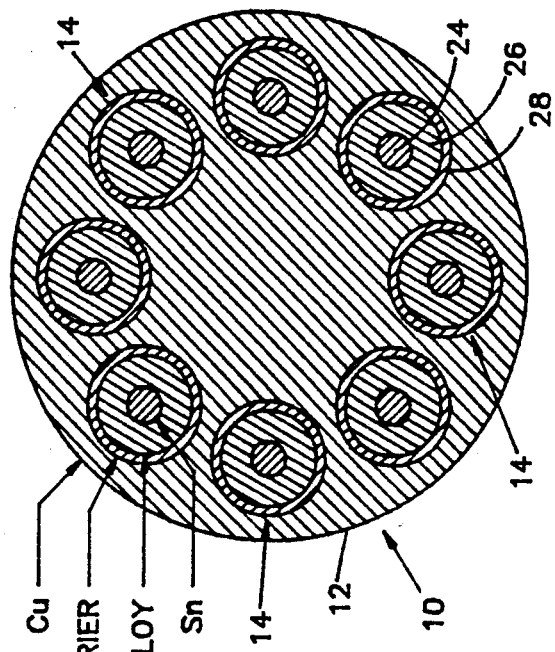
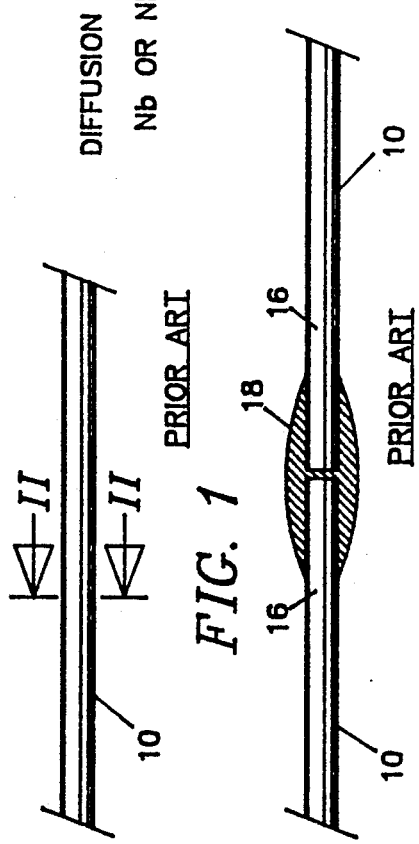
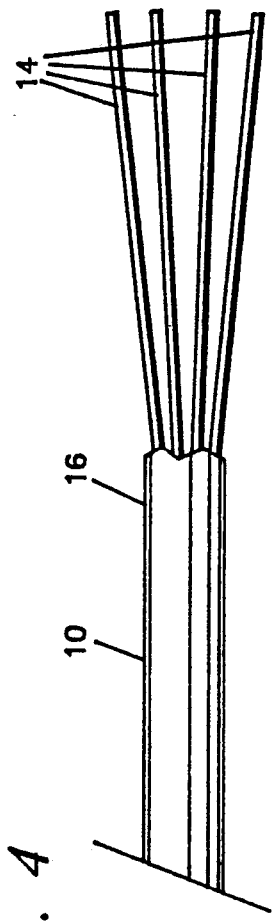

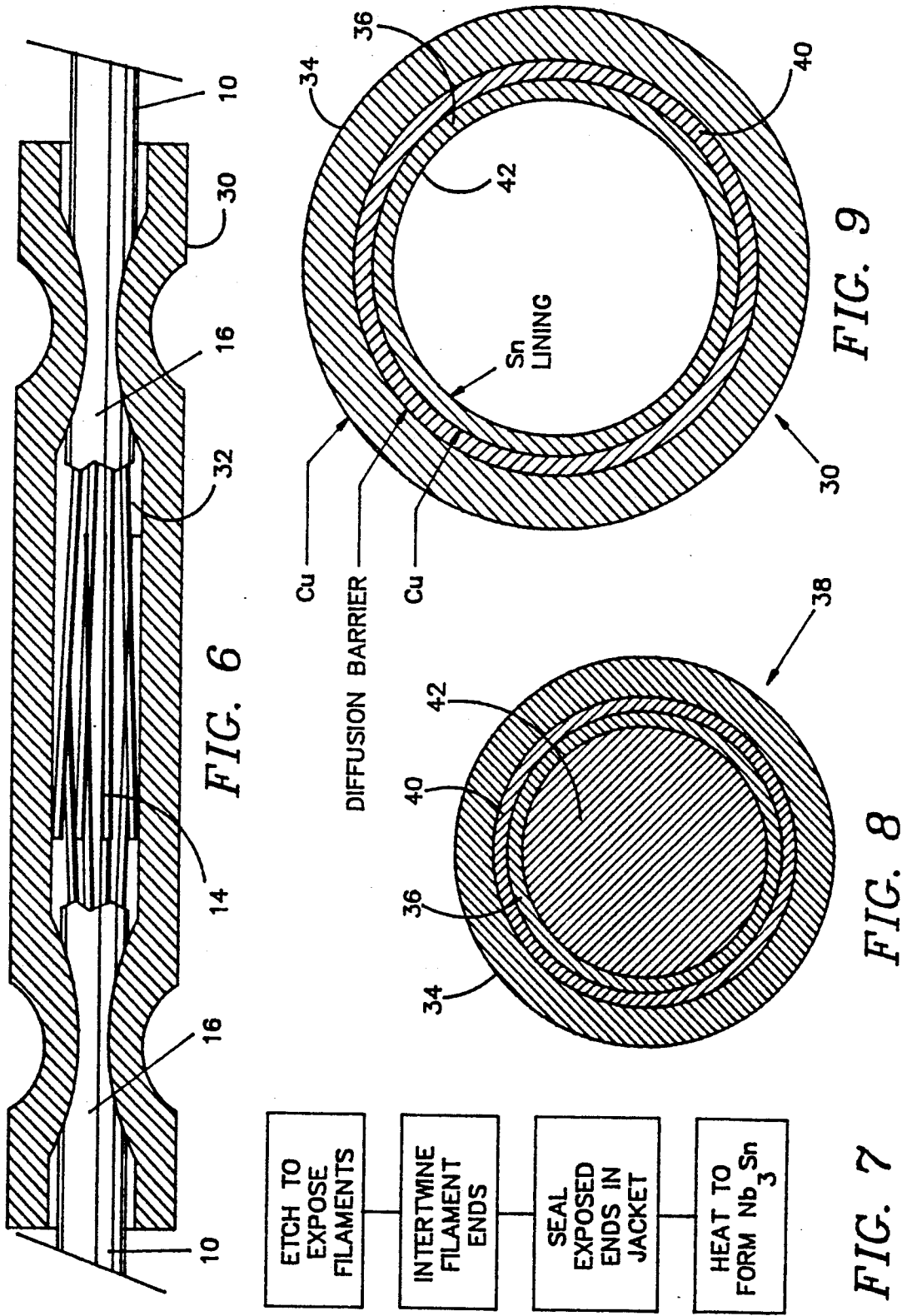

METHOD AND APPARATUS FOR PRODUCING SUPERCONDUCTING JOINTS

BACKGROUND OF THE INVENTION

The present invention relates to methods and apparatus for joining wires and, more particularly, in superconducting wires comprising a bundle of filaments of tin (Sn) and niobium (Nb) contained within a binder metal to the method of joining two wires with a superconducting joint comprising the steps of, exposing the filaments on the ends of the wires to be joined; intertwining the exposed filaments; sealing the exposed filaments in a copper-enriched chamber; and, heating the chamber to a temperature and for a time sufficient for the Sn and Nb to diffuse together sufficiently and form $Nb_3Sn$ at their interface.

Technology related to superconducting wires, and the like, is becoming an increasingly important area of technical investigation. Because of the property of extremely low resistance, energy losses through superconducting conductors are modest. Typical known superconducting conductors are composite structures formed by complicated extruding techniques as typified by the McDonald U.S. Pat. Nos. (4,262,412 and 4,414,428). As stated by the abstract of the McDonald '412 patent, the intent is to produce a "composite rod or wire of increased strength and fineness wherein the composite is formed by reducing a lamina of two metals which have been rolled to form a cylindrical billet wherein one of the metals is in expanded form. The composite produced can be encased in copper and fabricated to produce a superconductor. Alloys contemplated for producing superconductors are $Nb_3Sn$, $Nb_3Ga$, $Nb_3Ge$, $Nb_3Si$, $NbTi$, $V_3Ga$, $V_3Si$, $V_3Sn$, $V_3Al$, and $V_3Ge$ laminated on bronze, Al, Cu, Ta, or combinations thereof."

As depicted in simplified form in FIG. 1, according to one method of the above-referenced McDonald patents is to form a "jellyroll" billet of the component metals and then extrude the billet to form a thin wire 10 which, as shown in the cross-section of FIG. 2, is a composite of copper (Cu) 12 encasing a plurality of filaments generally indicated as 14. Suitable methods for producing fine superconducting wires, therefore, exist in the prior art. The same cannot be said for the joining of such wires. To use $Nb_3Sn$ wire in Nuclear Magnetic Resonance (NMR) and other persistent mode requirement magnets, and the like, superconducting joints must be made between separate lengths of wire to close the magnetic circuit. In that regard, the prior art still employs techniques and apparatus normally used for the joining of common copper conductors, and the like. For example, as depicted in FIG. 3, the ends 16 of the wires 10 are sometimes joined by a joining metal 18 using welding or brazing techniques. An alternative prior art technique is shown in FIG. 4 wherein a metal sleeve 20 is placed over the wire ends 16 and crimped or "swaged" to compress the metal of the sleeve 20 into gripping contact with the wires 10 and, thereby, affect a mechanical joint.

While information on joint technology is, in general, not widely disseminated within the developing superconductor art, it is the understanding of the inventors herein that such techniques as shown in FIGS. 3 and 4 are used and drive the users to employ conductors with large filaments to reduce the tediousness of the joining task. For $Nb_3Sn$, the most popular alloy at present for low temperature superconductors, this is difficult because the large filaments become brittle in the process and, therefore, there is introduced severe limitations in wire design. This is particularly true with respect to the location of the copper stabilizer in the billet and the final drawn wire.

It is, therefore, an object of the present invention to provide a method and apparatus for use in the joining of superconductors which will permit a non-tedious joining of superconductors employing fine filaments.

It is another object of the present invention to provide a method and apparatus for use therewith which will allow the joining of superconductors in a manner which does not impose severe limitations on conductor design.

It is still another object of the present invention to provide a method and apparatus for use therewith which will allow the joining of superconductors in a manner which will not cause the filaments to become brittle as a result of the making of the joint.

Other objects and benefits of the present invention will be apparent from the description of the invention which follows hereinafter when taken in conjunction with the drawing figures which accompany it.

SUMMARY

The foregoing objects have been attained in superconducting wires comprising a bundle of filaments of tin (Sn) and niobium (Nb) contained within a binder metal by the method of the present invention for joining two or more wires with a superconducting joint comprising the steps of, exposing the filaments on the ends of the wires to be joined; intertwining the exposed filaments; sealing the exposed filaments in a copper-enriched chamber; and, heating the chamber to a temperature and for a time sufficient for the Sn and Nb to diffuse together and form $Nb_3Sn$ at their interface.

In the preferred embodiment, the chamber is heated to a temperature in the range of 600° C. to 700° C. The preferred step of sealing the exposed filaments in a copper-enriched chamber comprises, forming a tubular jacket; placing the tubular jacket over the exposed filaments and the wire ends adjacent thereto; and, swaging the ends of the tubular jacket to the wire ends adjacent the exposed filaments. The preferred jacket is formed by obtaining wire comprising a thick outer layer and a thin inner layer of copper separated by a thin barrier layer of a material chosen from the group consisting of vanadium, niobium, and tantalum, or the like, all disposed over a tin core; cutting the wire to desired jacket lengths; heating the jacket lengths of the wire to melt the tin cores thereof; and, blowing the melted cores from the jacket lengths of the wire to form hollow cored jackets.

The preferred method of exposing the filaments comprises exposing the wire ends to an acid such as nitric acid which will attack the copper binder metal at a faster rate than it will attack tin or niobium for a period of time sufficient to remove the copper from the wire end while leaving the tin and niobium available for the practice of the present invention.

DESCRIPTION OF THE DRAWINGS

FIG. 1 is a simplified side view of a section of prior art superconducting wire as wherein the present invention is applicable.

FIG. 2 is a cross-section through the filamented superconducting wire of FIG. 1 in the plane II—II.

FIG. 3 is a cross-section through a joint between two filamented superconducting wires according to a first prior art technique.

FIG. 4 is a cross-section through a joint between two filamented superconducting wires according to a second prior art technique.

FIG. 5 is a drawing showing the end of a filamented superconducting wire with the filaments thereof exposed by etching following the first step of the method of the present invention.

FIG. 6 is a partially cutaway sideview drawing of two filamented superconducting wires disposed to be joined in end-to-end relationship within a sealing jacket according to the present invention.

FIG. 7 is a block diagram of the steps of the method of the present invention.

FIG. 8 is a cross-section through a piece of wire employed to make a sealing jacket according to the present invention in the preferred embodiment thereof.

FIG. 9 is a cross-section through a sealing jacket according to the present invention in the preferred embodiment thereof as made from the wire of FIG. 8 following removal of the tin core thereof by heating and blowing.

DESCRIPTION OF THE PREFERRED EMBODIMENT

The present invention is based on the proposition of growing the alloy $Nb_3Sn$ within a sealed joint area containing the exposed filaments of two (or more, if desired or required) superconducting wire ends. The preferred superconducting wire construction for use with the joining method of the present invention is shown with particularity in FIG. 2. The preferred wire 10 is produced employing a so-called modified "jellyroll" (MJR) billet technique of the type generally described in the abovementioned McDonald patents. The stabilizing encasing material 22, in that product, is copper. Each of the filaments 14 comprises a tin (Sn) core 24 surrounded by an outer layer 26 of niobium (Nb) or Nb alloyed with Ti, Ta, Zr, Hf, Sn, V, Fe, Ni, or the like. The outer layer 26 is covered by a diffusion barrier 28 of vanadium (V) or V alloyed with Ti, Nb, Zr, Cr or the like.

As depicted by the method block diagram of FIG. 7, the first step is to expose the filaments 14 on the ends of the wires 10 which are to form the joint area. This is most easily accomplished with the preferred wire construction of FIG. 2 by an etching process. More specifically, by exposing the wire end to nitric acid, the copper encasing material 22 and vanadium diffusion barrier 28 are thereby rapidly removed. On the other hand, under the proper conditions, the Nb outer layer 26 is unaffected by the nitric acid while the Sn inner core is attacked much more slowly by the nitric acid. The precise conditions for the described step of etching can vary. The selection of acid strength, time, temperature, and the like, can be made without undue experimentation to achieve the selective etching results sought.

The exposed filaments 14 of two (or more) wire ends to be joined are then intertwined and sealed inside of a joint-forming enclosure where they are heated to cause the growing of $Nb_3Sn$ between the filaments to join them. The wires can be placed either side-by-side (not shown) or end-to-end as depicted in FIG. 6. The preferred approach to the sealing process is the use of a sealing jacket 30 which is then swaged to the wires 10 beyond the exposed filaments 14 to form a sealed compartment 32 containing the exposed filaments 14. A plain copper tube can be employed for a jacket 30. It is preferred that the jacket 30 be of a composite construction as depicted in cross-section in FIG. 9. The jacket 30 can be formed from lengths of wire 38 as shown in cross-section in FIG. 8. The preferred wire 38 used to form the jackets 30 has a thick outer layer 34 and a thin inner layer 36 of copper separated by a thin barrier layer 40 of vanadium, niobium, tantalum, or the like. This is all disposed over a tin core 42. The diameter of the core 42 should be substantially the diameter desired for the jacket to fit snugly over the exposed filaments 14 and wire ends 16. The wire 38 is best formed by a drawing process. It is important that some copper must be present in the region of the exposed filaments 14 within the compartment 32 in order for $Nb_3Sn$ to form at lower temperatures so as not to contribute to brittleness of the wire. Without the copper to act in the manner of a catalyst or flux, a temperature of at least 930° C. is necessary for $Nb_3Sn$ to form, which would promote undesirable brittleness in the joint. Once the wire 38 has been cut to appropriate lengths for the jackets 30 (in tested embodiments, 2-3 inches), the lengths are heated to between 230° C. and 300° C. to melt the tin core 42; which is then blown out with a blast of air, or the like, to form the jacket 30 of FIG. 9. The jacket 30 is then slipped over the exposed filaments 14 and wire ends 16 and swaged in place to seal the ends around the wires 10.

With the exposed filaments 14 contained within the copper-rich, sealed compartment 32 formed by the swaged jacket 30 as depicted in FIG. 6, the joint is then heated to grow the connecting $Nb_3Sn$. The "growing" process is accomplished by the migration and diffusion of materials contained within the compartment 32 and, in this regard, is similar to the known diffusion bonding techniques employed to join titanium components in aircraft structures, and the like. In tested embodiments of the present invention, the growing, joint-forming process took place over a period of 96 hours at a temperature of 700° C. As will be appreciated by those skilled in the art, temperatures in the range of 600° C. to 700° C. could be used with appropriate adjustment in the heating time.

An important aspect of the present invention is that the joint is made during heat treatment of the wire, not after. Anticipated advantages include: (1) complete superconductivity in the joint; (2) no wire movement after heat treatment; (3) inclusion of a stabilizer, i.e., copper, in the joint; and (4) all handling is done when the wire is in a ductile state, thereby preventing breakage.

It is important to emphasize that if the jacket 30 is not tightly sealed or there is too much dead space between the filaments 14 and the inside of the jacket 30, Sn may leak into the joint from the nearby wire causing poor reaction away from the joint. Thus, one should assure that the jacket 30 is close-fitting and make sure that it is sealed tightly and close adjacent to the inner ends of the exposed filaments 14.

Wherefore, having thus described the present invention, what is claimed is:

1. In unalloyed wires for superconducting said wires comprising a bundle of filaments of tin (Sn) and niobium (Nb) contained within a binder metal, a method of joining two wires with a superconducting joint comprising the steps of:

a) exposing the filaments on the ends of the wires to be joined;
b) intertwining the exposed filaments;
c) sealing the exposed filaments in a copper-enriched chamber; and,
d) heating the chamber to a temperature and for a time sufficient for the Sn and Nb to diffuse together and form Nb$_3$Sn at their interface.

2. The method of forming a superconducting joint between two wires of claim 1 wherein said step of heating the chamber to a temperature and for a time sufficient for the Sn and Nb to diffuse together and form Nb$_3$Sn at their interface comprises:
heating the chamber to a temperature in the range of 600° C. to 700° C.

3. The method of forming a superconducting joint between two wires of claim 1 wherein said step of sealing the exposed filaments in a copper-enriched chamber comprises the steps of:
a) forming a tubular jacket;
b) placing the tubular jacket over the exposed filaments and the wire ends adjacent thereto; and
c) swaging the ends of the tubular jacket to the wire ends adjacent the exposed filaments.

4. The method of forming a superconducting joint between two wires of claim 3 wherein said step of forming a tubular jacket comprises the steps of:
a) obtaining wire comprising a thick outer layer and a thin inner layer of copper separated by a thin barrier layer of a material chosen from the group consisting of vanadium, niobium, and tantalum, or the like, all disposed over a tin core;
b) cutting the wire to desired jacket lengths;
c) heating the jacket lengths of the wire to melt the tin cores thereof; and
d) blowing the melted cores from the jacket lengths of the wire to form hollow cored jackets.

5. The method of forming a superconducting joint between two wires of claim 1 wherein the binder metal is copper and said step of exposing the filaments on the ends of the wires to be joined comprises the step of:
exposing the wire ends to an acid which will attack the copper at a faster rate than it will attack tin or niobium for a period of time sufficient to remove the copper from the wire end and leave the tin and niobium.

6. The method of forming a superconducting joint between two superconducting wires of claim 5 wherein said step of exposing the wire ends to an acid comprises:
placing the wire ends in nitric acid.

7. A method of joining two non-superconducting wires comprising a bundle of filaments of tin (Sn) unalloyed with niobium and niobium (Nb) unalloyed with tin contained within a copper binder metal, to form a superconducting joint of Nb$_3$Sn comprising the steps of:
a) exposing the filaments on the ends of the wires to be joined by placing the wire ends in an acid of a type and concentration which will attack the copper at a faster rate than it will attack tin or niobium for a period of time sufficient to remove the copper from the wire end and leave the tin and niobium;
b) intertwining the exposed filaments;
c) sealing the exposed filaments in a copper-enriched chamber; and,
d) heating the chamber to a temperature in the range 600° C. to 700° C. for a time sufficient for the Sn and Nb to diffuse together and simultaneously form Nb$_3$Sn at their interface.

8. The method of forming a superconducting joint between two wires of claim 7 wherein said step of sealing the exposed filaments in a copper-enriched chamber comprises the steps of:
a) forming a tubular jacket;
b) placing the tubular jacket over the exposed filaments and the wire ends adjacent thereto; and
c) swaging the ends of the tubular jacket to the wire ends adjacent the exposed filaments.

9. The method of forming a superconducting joint between two wires of claim 8 wherein said step of forming a tubular jacket comprises the steps of:
a) obtaining wire comprising a thick outer layer and a thin inner layer of copper separated by a thin barrier layer of a material chosen from the group consisting of vanadium, niobium, and tantalum, or the like, all disposed over a tin core;
b) cutting the wire to desired jacket lengths;
c) heating the jacket lengths of the wire to melt the tin cores thereof; and
d) blowing the melted cores from the jacket lengths of the wire to form hollow cored jackets.

10. The method of forming a superconducting joint between two wires of claim 7 wherein said step of placing the wire ends in an acid comprises:
placing the wire ends in nitric acid.

11. A method of joining a bundle of wire filaments comprising tin (Sn) unalloyed with niobium and niobium (Nb) unalloyed with tin comprising the steps of:
a) exposing the filaments on the ends of the wires to be joined by placing the wire ends in an acid of a type and concentration which will attack the copper at a faster rate than it will attack tin or niobium for a period of time sufficient to remove the copper from the wire end and leave the tin and niobium;
b) intertwining the exposed filaments;
c) placing a tubular jacket having copper adjacent an inner surface thereof over the exposed filaments and the wire ends adjacent thereto;
d) swaging the ends of the tubular jacket to the wire ends adjacent the exposed filaments whereby the exposed filaments are sealed in a copper-enriched chamber; and
e) heating the chamber to a temperature in the range of 600° C. to 700° C. for a time sufficient for the Sn and Nb to diffuse together and simultaneously form Nb$_3$Sn at their interface.

12. The method of forming a superconducting joint between two wires of claim 11 and additionally including step of forming the tubular jacket comprising the steps of:
a) obtaining wire comprising a thick outer layer and a thin inner layer of copper separated by a thin barrier layer of a material chosen from the group consisting of vanadium, niobium, and tantalum, or the like, all disposed over a tin core;
b) cutting the wire to desired jacket lengths;
c) heating the jacket lengths of the wire to melt the tin cores thereof; and,
d) blowing the melted cores from the jacket lengths of the wire to form hollow cored jackets.

13. The method of forming a superconducting joint between two wires of claim 11 wherein said step of placing the wire ends in an acid comprises:
placing the wire ends in nitric acid.

* * * * *